United States Patent [19]
Connor et al.

[11] Patent Number: 5,553,082
[45] Date of Patent: Sep. 3, 1996

[54] BUILT-IN SELF-TEST FOR LOGIC CIRCUITRY AT MEMORY ARRAY OUTPUT

[75] Inventors: John P. Connor, Burlington; Luigi Ternullo, Jr., Colchester, both of Vt.

[73] Assignee: International Business Machines Corporation, Armonk, N.Y.

[21] Appl. No.: 432,310

[22] Filed: May 1, 1995

[51] Int. Cl.[6] .................................................. G01R 31/28
[52] U.S. Cl. ......................................... 371/25.1; 371/22.3
[58] Field of Search ........................... 365/201; 371/22.3, 371/22.4, 22.5, 25.1; 395/183.06

[56] References Cited

U.S. PATENT DOCUMENTS

| | | | |
|---|---|---|---|
| 4,404,519 | 9/1983 | Westcott | 324/73 R |
| 4,817,093 | 3/1989 | Jacobs et al. | 371/25 |
| 5,042,034 | 8/1991 | Correale, Jr. et al. | 371/22.3 |
| 5,101,409 | 3/1992 | Hack | 371/22.3 |
| 5,138,619 | 8/1992 | Fasang et al. | 371/21.1 |
| 5,172,377 | 12/1992 | Robinson et al. | 371/22.3 |
| 5,173,906 | 12/1992 | Dreibelbis et al. | 371/22.5 |
| 5,260,947 | 11/1993 | Posse | 371/22.3 |
| 5,442,640 | 8/1995 | Bardell, Jr. et al. | 371/21.1 |

FOREIGN PATENT DOCUMENTS

| | | |
|---|---|---|
| 0451985A2 | 3/1991 | European Pat. Off. |
| 4-208880 | 5/1992 | Japan. |

*Primary Examiner*—Vincent P. Canney
*Attorney, Agent, or Firm*—Heslin & Rothenberg, P.C.

[57] ABSTRACT

Built-in self-testing of embedded logic circuitry at the output of an on-chip memory array is presented. Testing is accomplished by generating on chip a test pattern which is provided to the logic circuitry by writing at least a portion thereof into the memory array and then reading that portion out of the memory array, to the embedded logic circuitry. Three specific embodiments are presented, each of which employs a deterministic looping test pattern that comprises a portion of the generated test pattern. The looping test pattern may be either written through the memory array to the embedded logic circuitry or written around the memory array directly to the logic circuitry.

22 Claims, 12 Drawing Sheets

BUILT-IN SELF-TEST FOR LOGIC CIRCUITRY AT MEMORY ARRAY OUTPUT

TECHNICAL FIELD

This invention relates in general to testing of integrated circuits, and more particularly, to built-in self-testing of embedded logic circuitry connected to an output of a memory array, without employing boundary scan latches within the functional data path connecting the memory array and logic circuitry.

BACKGROUND ART

As the integrated circuit art has advanced, more and more circuit devices, and consequently more and more circuit functions, have been placed on single chips. These developments have posed problems with regard to the testing Of such chips. For example, while testing of even an extremely large memory array chip may be relatively straightforward, a chip that integrates various different kinds of functions, including an embedded memory array and logic, may pose problems for the circuit designer/tester who desires adequate testability of the embedded structures. For example, such embedded memory arrays typically have far fewer input/output (I/O) pins available to the circuit tester than a memory array occupying a stand alone chip. The problems associated with testing embedded memory arrays extend also to embedded logic functions.

A general solution to the above-described problem is to embed test circuitry on the chip itself. Such schemes are frequently referred to as Built-In Self-Test ("BIST") or Array Self-Test ("AST"). Hereinafter, such arrangements are referred to generically as BIST circuits. These circuits are well known in the art; for example, reference commonly assigned U.S. Pat. No. 5,173,906, entitled "Built-In Self-Test For Integrated Circuits."

Also, to alleviate access requirements device manufacturers have designed components that include so-called "scan circuitry" in addition to the circuitry required for normal operation in functional mode of the component. The scan facility enables such chip components to switch from ordinary operation into a "scan" mode used for testing. This facility enables a tester to take a "snapshot" of the signals at nodes within the integrated circuit where physical access would otherwise be difficult or impossible.

One type of scan organization is known as "boundary" scan because the nodes with which the scan circuitry is associated are input and output ports used in normal component operations; the nodes are thus in a sense on the "boundary" of the circuit to be tested. When such components have been switched from normal operation to scan mode, boundary scan latches can not only be loaded and read serially, but can also be caused both to receive and transmit data in parallel. By using the boundary-scan facility, one can effectively apply and sense signals at all scan-component terminals by direct physical access to the input and output ports of a component. Details of a standard approach to boundary-scan operation are described in IEEE Standard 1149.1, which sets forth a set of accepted operational parameters and definitions for boundary-scan components.

Existing circuit test methodologies have often employed boundary scan latches between memory blocks, between memory and logic, and between multiple logic blocks. Separation between blocks is usually made at cycle boundaries to allow efficient single cycle testing to take place from the scan chain, which in most cases is a viable approach. However, in certain designs the separation of logic and memory can prove to be costly because of performance degradation and increased area consumption on the chip. Further, in the case of Content Addressable Memory (CAM), where the memory cell and XNOR gate of a comparator are physically coupled, the introduction of boundary latches between the memory and logic is impossible.

Comparator logic embedded at an output of a memory array is becoming more and more common. Faster cycle times and increased operations per cycle require that boundary scan latch placement be minimized. For example, boundary latches between the output of a memory array and one input to a wide comparator logic circuit cannot be accomplished while still accommodating a cycle time of only several nanoseconds. The addition of a boundary scan latch at the memory array/comparator logic interface would require an additional cycle for the logic to be evaluated due to the data transition through the latch, thereby severely impacting machine performance. Further, with wide comparator logic, for example, 288 bits wide, the addition of a corresponding number of boundary scan latches would utilize a significant area of the semiconductor device. Additionally, testing time would be very high for such circuitry. To minimize testing time, comparator logic has typically been broken into discrete logic sections. Unfortunately, this might require a comparator design which includes additional boundary scan latches, thereby further degrading performance.

Thus, a need exists in the semiconductor art for a test structure and corresponding test method which do not employ scannable boundary latches between the memory array and subsequent logic circuit, while still achieving 100 percent test confidence of the subsequent logic circuit, preferably in a minimum number of cycles.

DISCLOSURE OF INVENTION

Briefly summarized, this invention comprises in a first aspect a system for testing embedded logic circuitry coupled to a memory array. The system includes Built-In Self-Test (BIST) means for generating a test pattern for testing the logic circuitry and means for providing at least a portion of the test pattern to the logic circuitry by writing that test pattern portion to the memory array and then reading the test pattern portion from the memory array and presenting it to the logic circuitry for testing. Numerous enhancements to this basic system are also presented.

In another aspect, the invention comprises an integrated circuit chip having a memory array, a logic circuit and on-chip Built-In Self-Test (BIST) means for testing the logic circuit. The memory array stores data and has an input port and an output port. The logic circuit is electrically coupled to the output port of the memory array so that stored data read from the memory array flows via the output port to the logic circuit. The on-chip BIST means for testing the logic circuit includes means for generating a test pattern for testing the logic circuit and means for providing the test pattern to the logic circuit. The means for providing the test pattern to the logic circuit comprises means for writing at least a portion thereof into the memory array and then reading that portion out of the memory array via the output port to the logic circuit for testing the logic circuit.

In still another aspect, the invention comprises a method for testing embedded logic circuitry coupled to a memory array. The logic circuitry is either directly coupled to the storage cells of the memory array, as in a CAM design, or is coupled to an output port of the memory array. The method includes the steps of: employing a Built-In Self-Test (BIST) to generate a test pattern for testing the logic circuitry; writing at least a portion of the test pattern into the memory array; and applying the portion of the test pattern in the memory array to the logic circuitry for testing thereof.

To restate, this invention comprises on-chip built-in self-testing of a logic circuit embedded at an output of a memory array without employing boundary scan latches within the functional data path between the memory array and the logic circuit. By eliminating the need for boundary scan latches or multiplexers at the interface, both functional and testing performance is enhanced, testing time is decreased, and silicon chip area consumed by the testing circuitry is minimized. One hundred percent "stuck-fault coverage" of comparator logic at the output of an address memory array is obtained in the embodiment set forth herein, with a minimum number of test cycles. The design discussed presents only one fail/pass bit as an observable output. Monitoring of this fail bit on a tester allows for fails to be pinpointed by cycle counting. The design can be used for self-test of hardware at the wafer level or system level, e.g., at power on.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Numerous implementations of the basic concepts disclosed herein are possible. By way of example, three specific implementations are presented. Significant to each of these implementations is the elimination of scannable latches from the functional data path interface between an embedded memory array and a logic circuit coupled to its output, without compromising testability of the logic circuit. The specific memory arrays discussed herein are assumed to comprise the well known TAG memory or directory memory residing on today's microprocessor chips. Further, the logic circuitry at the output of these memory arrays is assumed to comprise comparator logic, which by nature of design is very random pattern resistant and therefore susceptible to deterministic testing. Those skilled in the art should note, however, that the concepts presented herein are equally applicable to testing of any logic circuitry at the output of any memory array, using any test pattern, i.e., deterministic, random or pseudo-random test pattern.

Figure 1:
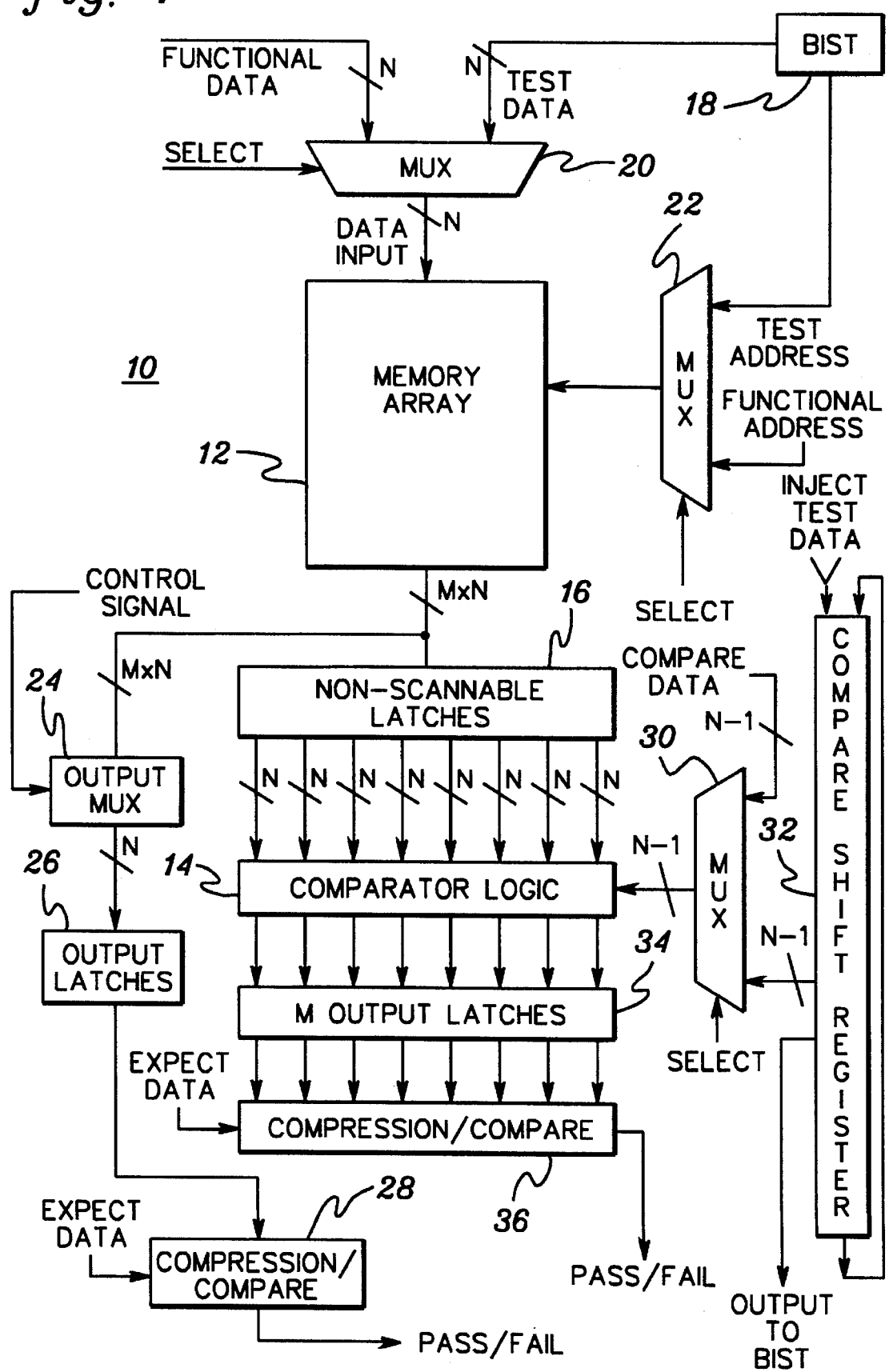
FIG. 1 is a block diagram of one embodiment of on-chip memory array/comparator logic test circuitry in accordance with the present invention.

Referring now to the drawings, wherein the same reference numbers used throughout multiple figures designate the same or similar components, FIG. 1 depicts memory/logic test circuitry, denoted 10, for implementing logic circuit testing in accordance with the present invention. Circuit 10 is assumed to comprise a portion of a microprocessor chip wherein "functional data," "functional address," and "compare data" comprise operational mode signals received from elsewhere on the microprocessor chip. Circuit 10 includes a memory array 12 and comparator logic 14 coupled to the output ports of memory array 12 through, in this embodiment, non-scannable latches 16. By way of example, latches 16 could comprise simple polarity hold latches which are well known in the art to be structurally and functionally distinct from boundary scan latches. Significantly, non-scannable latches 16 have no test data input which could provide for the scanning in or out of data.

In accordance with this invention, testing of comparator logic 14 is partially accomplished by functionally employing memory array 12. A built-in self-test (BIST) 18 supplies predefined deterministic patterns needed to test comparator logic 14 in an efficient manner that allows for complete "stuck-fault" testing of the logic with a small set of test patterns in a minimum number of cycles. Test data input to memory array 12 from BIST 18 is via a multiplexer circuit 20, which may comprise multiple multiplexers connected in parallel. Multiplexer 20 can be controlled by a SELECT signal, e.g., generated by BIST 18, to appropriately switch between functional data and test data inputs for operational mode and test mode, respectively. Although not shown, BIST 18 would also be coupled to the conventional read/write control lines to memory array 12.

Memory array 12 is assumed to comprise a plurality of word lines and bit lines, with each word line or row being segregated into multiple memory locations M, wherein $M \geq 2$, each N bits wide, wherein $N \geq 1$. As described further herein, each memory location M is assumed to contain a plurality of bits, one of which may comprise an "invalid data bit," which when asserted disables output from a corresponding portion of comparator logic 14. By way of example, the "N" bits might comprise 37 bits, one of which is the invalid data bit, and the "M" locations might comprise 8 memory sections or locations within a single row of memory array 12, such that each row of memory consists of 8×37 bits. BIST 18 addresses array 12 via an address multiplexer 22 that receives as input a test address from BIST 18 or a functional address from elsewhere on the microprocessor chip. The "SELECT" signal again switches multiplexer 22 between functional mode and test mode.

In addition to feeding non-scannable latches 16, output from memory array 12 is also supplied to an output multiplexer 24, which partially functions for conventional testing of memory array 12 itself. Output MUX 24 selects a particular memory section M within array 12 for test analysis as determined by a "control signal" received, for example, from BIST 18. Data from the selected "N" memory bits of the selected memory location M is presented through output latches 26 to a compression/compare circuit 28 which compares the retrieved data from memory array 12 with "expect data," which may simply comprise the inputted test data to the memory delayed by the number of cycles required to feed that data through the array. Output from compression/compare circuit 28 is a real time "pass/fail" signal which may be monitored for detection of a memory array failure.

Testing of memory array 12 as presented herein is know in the art as Array Built-In Self Testing (ABIST). For a further discussion of ABIST memory testing, reference commonly assigned U.S. Pat. No. 5,173,906, entitled "Built-in Self Test For Integrated Circuits." Assuming that memory array 12 passes testing, then the memory array is functionally employed in accordance with this invention to present test patterns to comparator logic 14, without employing boundary scan latches at the interface of memory array 12 and comparator logic 14.

Figure 2:
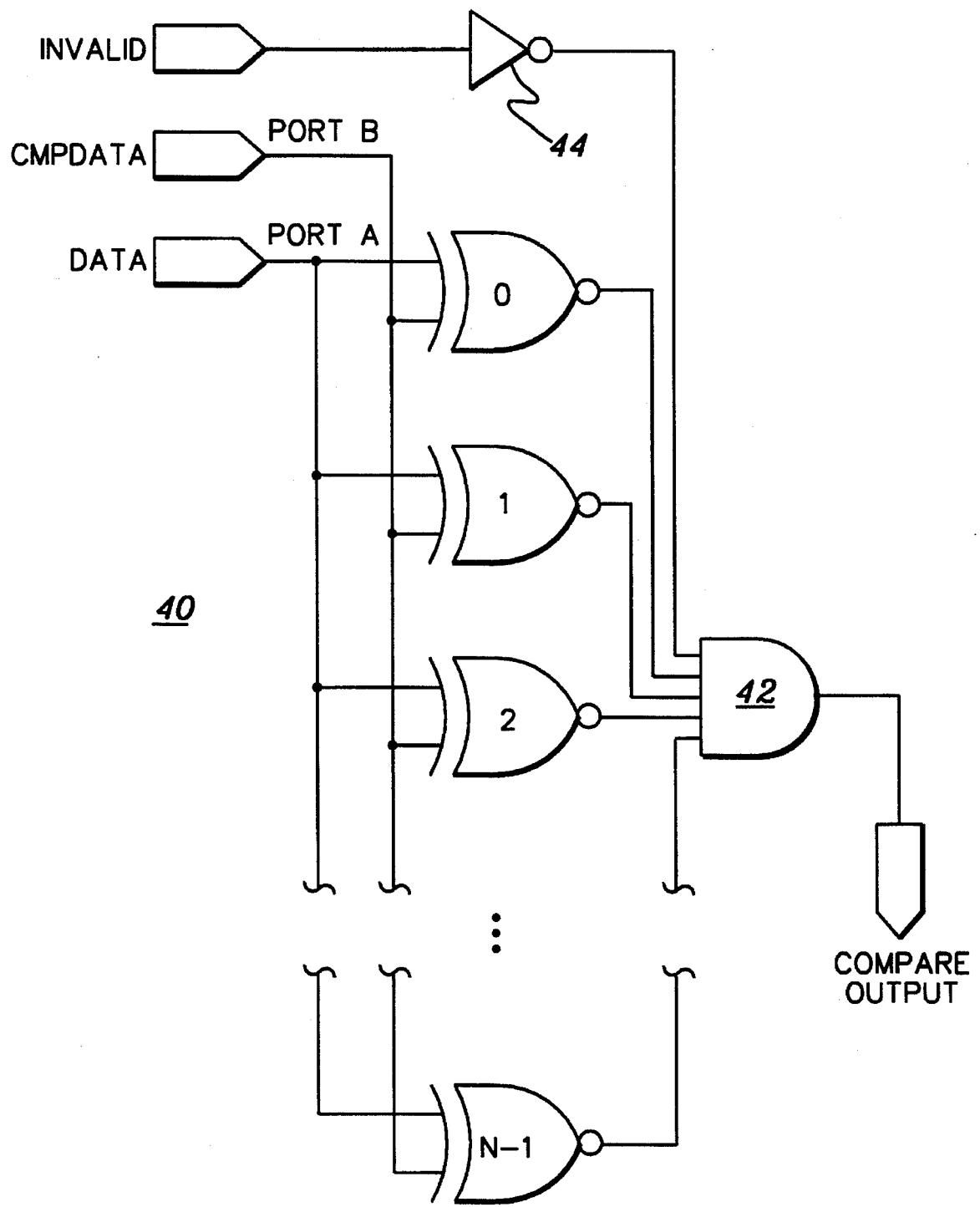
FIG. 2 is a schematic of one embodiment of a comparator for the comparator logic of FIG. 1.

As an example, comparator logic 14 comprises M two-input comparators each connected to receive at a port A input N bits from a respective memory location M within memory array 12. FIG. 2 depicts one embodiment of a comparator 40, which is assumed to be repeated M times within comparator logic 14. Each comparator 40 comprises N-1 two-input exclusive-NOR (XNOR) gates connected in parallel to receive at port A data from memory array 12 and at port B a compare data "CMPDATA" signal received through a compare multiplexer 30 (FIG. 1). Outputs from the XNOR gates are fed to an AND gate 42, which provides the comparator 40 output. Also fed to AND gate 42, after passing through an inverter 44, is the invalid data bit from the corresponding memory location M of memory array 12 (FIG. 1).

The patterns to accomplish full stuck-fault testing of a two-input XNOR gate are 00, 01, 10, 11. An AND gate requires a pattern of all 1s to ensure that the inputs are not stuck to a zero state. A "stuck-at-one" test is also required and can be accomplished by applying all 1s to the inputs and then walking a zero across the inputs. Given these pattern requirements, the following pattern set was devised to test a comparator N-1 bits wide. A field of all 1s is first applied to allow all the XNOR gates to match and, in turn, supply all 1s to the inputs of the AND gates, thereby propagating a 1 to the output of the comparator. A second pattern consists of a field of all 0s which allows the XNOR gates to compare. These two patterns cover the 00 and 11 case for the XNOR gate and the all 1s case for the AND gate.

The next set of patterns comprises the 01 case on the XNOR inputs. Through this pattern set, the outputs of the XNOR gates generate a marching 0 pattern on the AND gate inputs. This pattern set can be obtained by starting with all 0s and marching a 1 across one of the two inputs of the comparator, i.e., either port A or port B. The non-selected port receives an all 0s or an all 1s signal pattern through the memory array. In the embodiment of FIG. 1, the marching pattern occurs only on port B, i.e., the compare input to comparator logic 14 received through compare data multiplexer 30. As shown in FIG. 1, MUX 30 receives in addition to a functional "compare data" signal, a test pattern signal from a compare shift register 32. Compare shift register 32 provides N-1 bits of test data from BIST 18 to the port B input of comparator logic 14 through compare multiplexer 30. (Again, one bit of each N bit memory signal from memory array 12 comprises an invalid data bit which, as shown in FIG. 2, does not feed an XNOR gate.) The marching pattern causes all XNOR gates to match except the one gate which has a "1" on port B. This causes the final output of the comparator 40 to exhibit a "0" value, i.e., a miscompare value. The output from the multiple comparators comprising comparator logic 14 is fed in parallel to M output latches 34 (FIG. 1) for presentation to a compression/compare circuit 36, which outputs a single pass/fail signal after selecting the output from an appropriate comparator and comparing it to the corresponding "expect data" signal received from BIST 18.

One final pattern set is required to complete the test, i.e., to ensure that the other port (port A) of the XNOR gates of comparator 40 are not shorted to a "0". This test can be accomplished by placing a "1" on all the inputs to the XNOR gates and marching a "0" across the port B inputs, as in the case of the previous test pattern.

Figure 3A:
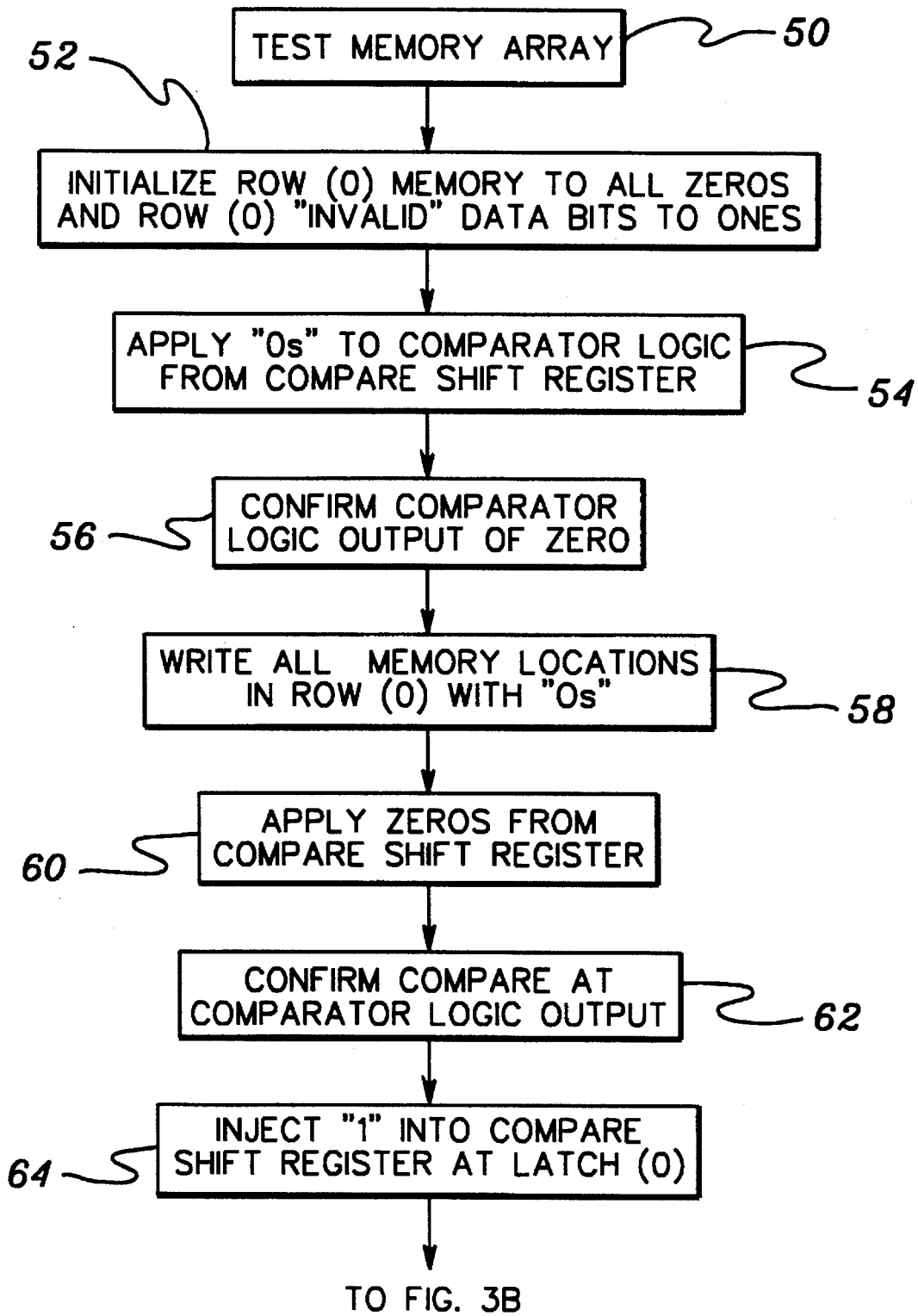
FIGS. 3a–3c is a flowchart of one embodiment of a test process for testing embedded logic at the output of the memory array in the memory array/comparator logic test circuitry of FIG. 1.
Figure 3B:
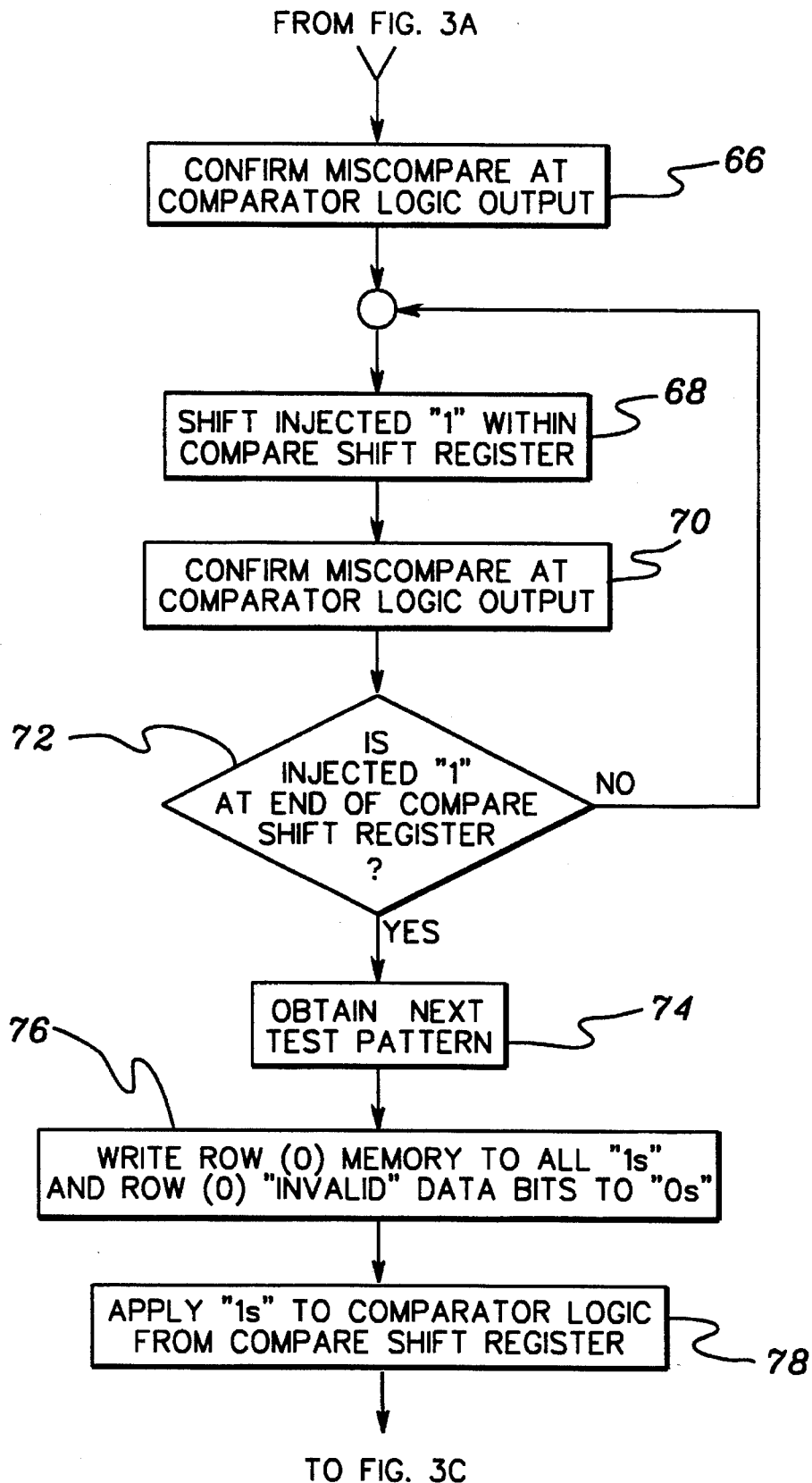
Figure 3C:
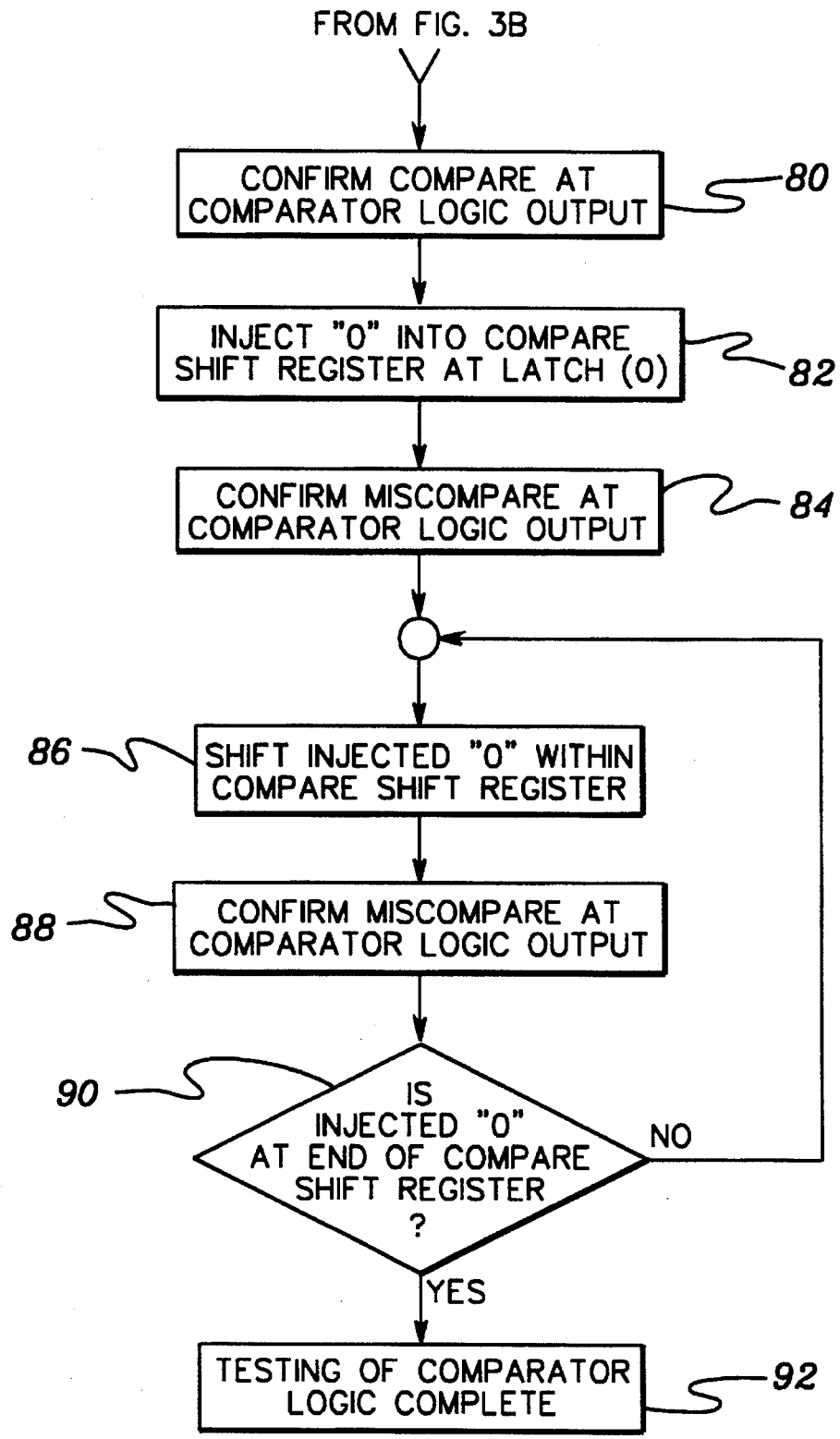

Assuming that the test data received from compare shift register 32 is applied to port B of each comparator 40 (FIG. 2) of logic 14 (FIG. 1), then the pattern sequence described above can be employed to simultaneously test all M comparators within logic 14. Parallel testing of comparators provides an M-fold reduction in the pattern set required. FIGS. 3a–3c present in greater detail one embodiment of logic circuit testing in accordance with this invention. This testing flow is written for the memory/logic circuit example of FIGS. 1 & 2.

Before commencing logic circuit testing, memory array 12 is tested by conventional array built-in self-testing 50 (FIG. 3a). Once the memory array passes testing, then the "invalid data bits" are tested by initializing a word line, arbitrarily chosen to be row (0), to all 0s except for the corresponding row (0) invalid data bits, which are initialized to all is 52. Again, when asserted the invalid data bits should disable the corresponding comparator logic outputs. All 0s are applied to the comparator logic from the compare shift register 54 and confirmation is obtained that comparator logic output from each comparator comprises a "0" 56. If an invalid data bit fails to activate, then output from the corresponding comparator output would comprise a compare (or "1") signal. The outputs of the various comparators are each compared with a single "0", "expect data" signal to ensure that each output passes the test, and thus that the corresponding "invalid data bits" are good.

Next, all bits in row (0) of the memory array are written with 0s 58. Again, writing of "0" into the invalid data bits deselects the invalid data bits and allows the comparator logic to function. The 0s from memory array row (0) are compared with all 0s from the compare shift register 60. All comparator outputs should go to "1". This is confirmed at the compression/compare block (FIG. 1), where the outputs from the various comparators are compared against an expect data of "1" 62.

If the number of comparators M within the compare logic is assumed to comprise eight, then eight cycles are required for the state machine (BIST) to sequence through (i.e., load) the eight memory locations within row (0) of the memory array. The value of 0 on the invalid data bits allows comparison of data on row (0) with that of the compare shift register in the ninth cycle, resulting in simultaneous testing of all M comparators.

In the tenth cycle, a "1" from the BIST is injected into the compare shift register at latch (0) 64, and confirmation is obtained of a miscompare at the comparator logic output 66. The injected "1" is then marched through each of the N-1 latches comprising the compare shift register 68. With each shift of the injected "1", confirmation of a miscompare at the comparator logic output is obtained 70. This shifting of the injected "1" requires N-2 cycles. As shown by the feedback line in FIG. 1, the "0" from the latch at the end of the compare shift register is fed back around to latch (0) as the injected "1" is propagated through the compare shift register. This walking of the injected "1" through the compare shift register occurs until the injected "1" is at the end latch of the register 72. At this point, an output signal from the daisy-chained latches comprising the compare shift register notifies the BIST state machine to transition to the next state. If desired, e.g., due to the number of stages employed in a pipeline architecture, the feedback signal can be sourced from a latch other than the end latch in the chain.

Once the injected "1" has traversed all bits of the port B input, the next test pattern is generated by the BIST 74. This new pattern comprises writing row (0) in the memory array to all 1s, except for the row (0) invalid data bits which are written all 0s 76, while simultaneously applying all is to the port B input of the comparator logic from the compare shift register 78 (which is assumed to have been parallel loaded). Because all is are written to both port A and port B inputs of the M comparators, the output of each comparator should be a compare (or "1"), which is verified by the compression/compare circuitry 80. Next, a "0" is injected into the compare shift register at latch (0) 82 and confirmation of a miscompare at the comparator logic outputs is obtained 84. As with the previous test pattern, the injected "0" is shifted within the compare shift register 86 and with each shift the "0" from the (N-1)$^{th}$ latch is fed back around to latch (0). At each location, confirmation of miscompares at the M comparator outputs is obtained 88. Once the injected "0" reaches the (N-1)$^{th}$ latch in the compare shift register 90, testing of the comparator logic in accordance with this embodiment of the invention is complete 92.

The particular test patterns employed will depend upon the logic circuitry at the output of the memory array. With the wide comparator logic discussed herein, deterministic pattern testing in a minimal number of cycles is very good. Table 1 summarizes the test patterns applied assuming that the comparator logic comprises eight comparators 37 bits wide, inclusive of an invalid data bit.

The circuitry and process embodiments depicted in FIGS. 4–7b comprise variations on those presented in FIGS. 1–3c. In particular, the looping of the injected "1" or "0" can be accomplished through the memory array, as in the embodiment of FIGS. 4–5c, or through both the memory array and the compare data inputs to the comparator logic, as in the embodiment of FIGS. 6–7b.

Figure 4:
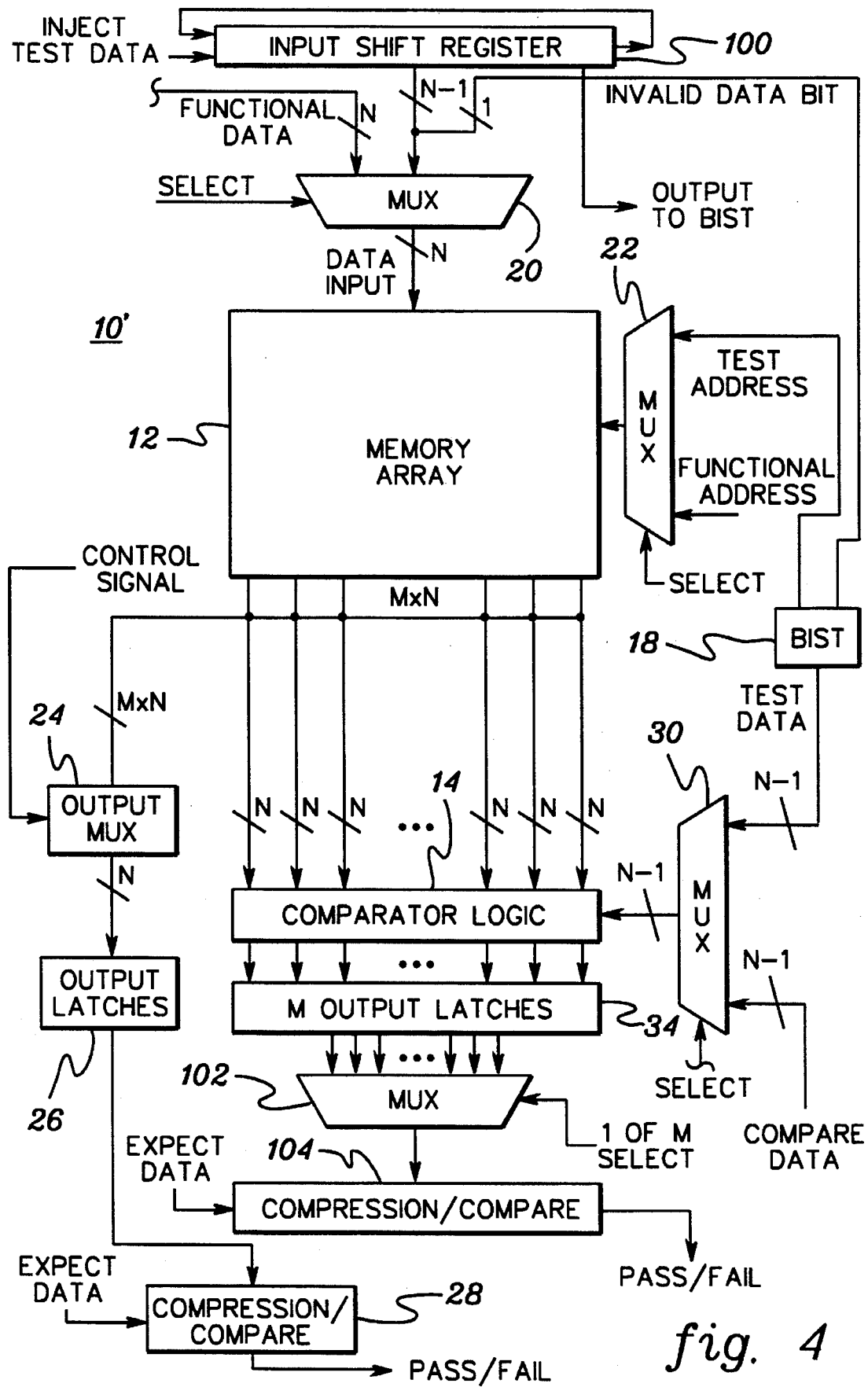
FIG. 4 is a block diagram of another embodiment of on-chip memory array/comparator logic test circuitry in accordance with the present invention.

Unless otherwise discussed, the memory/logic test circuitry, generally denoted 10', depicted in FIG. 4 is identical to circuitry 10 of FIG. 1. As a first variation, the test pattern looping function performed by the compare shift register 32 of FIG. 1 is performed in this embodiment by an input shift register 100 which outputs test data through MUX 20 to memory array 12 and ultimately to the port A input of each comparator 40 (FIG. 2) within comparator logic 14. For discussion, comparator logic 14 is again assumed to comprise M N-bit wide comparators each of which provides a single bit output to a corresponding latch of M output latches 34.

In contrast with the embodiment of FIGS. 1–3c, the all 1s and all 0s test patterns are fed to port B of comparator logic 14 in the embodiment of FIG. 4 directly from BIST 18 through multiplexer 30. Again, multiplexers 20, 22 and 30 are controlled by a "SELECT" signal generated by BIST 18, which switches the MUXs between functional mode and test mode. Instead of examining all comparators in parallel, the structure of FIG. 4 undertakes a serial examination of the comparator logic. Assuming M equals 8 such that there are eight comparators within comparator logic 14, there will almost be eight times the number of cycles required to test circuitry 10' compared with circuitry 10 of FIG. 1. The benefit, however, is that the circuitry 10' implementation facilitates diagnostics upon occurrence of a failure.

Operationally, testing of circuitry 10' is similar to testing of circuitry 10 of FIG. 1. In particular, after all 0s and all is testing, BIST 18 injects a "0" into a field of 1s or a "1" into a field of 0s established within input shift register 100. This injected test data is then looped through the input shift register with data at the (N-1)$^{th}$ latch being fed back around to the first latch with each shifting of the injected data. An output signal from register 100 informs BIST 18 once the injected test data has reached the (N-1)$^{th}$ latch in the input shift register. Note that in this embodiment, the invalid data bit for each memory location M in the array is separately fed from the BIST to the array through the input multiplexer.

Further, note that non-scannable latches 16 of FIG. 1 have been removed such that the output port of memory array 12 is connected directly to, for example, port A of the various comparators comprising comparator logic 14. With this design, the comparators compare data from memory array 12 in the same cycle as the data is written into the array. Also, note that output from the M output latches 34 is fed to a multiplexer 102 which receives a control signal, labeled "One of M Select," from BIST 18. Thus, output of a single comparator is fed via MUX 102 to compression/compare circuitry 104 for comparison with the single bit "expect data," also received from BIST 18. Output from compression/compare circuitry 104 comprises a pass/fail signal, which as noted, is more readily traceable to a particular

TABLE 1

| Cycle Number | Pattern Number | Mem.Data<0:35> Port A | Comp.Data<0:35> Port B | Invalid Data Bit | Output <0:7> |
|---|---|---|---|---|---|
| 1–8 | 1 | 00000 . . . . . . . . . 000 | 00000 . . . . . . . . . 000 | 1 | 00000000 |
| 9 | 2 | 00000 . . . . . . . . . 000 | 00000 . . . . . . . . . 000 | 0 | 11111111 |
| 10 | 3 | 00000 . . . . . . . . . 000 | 10000 . . . . . . . . . 000 | 0 | 00000000 |
| 11 | 4 | 00000 . . . . . . . . . 000 | 01000 . . . . . . . . . 000 | 0 | 00000000 |
| 12–44 | . . . | 00000 . . . . . . . . . 000 | . . . | 0 | 00000000 |
| 45 | 38 | 00000 . . . . . . . . . 000 | 00000 . . . . . . . . . 001 | 0 | 00000000 |
| 46–54 | 39 | 11111 . . . . . . . . . 111 | 11111 . . . . . . . . . 111 | 0 | 11111111 |
| 55 | 40 | 11111 . . . . . . . . . 111 | 01111 . . . . . . . . . 111 | 0 | 00000000 |
| 56 | 41 | 11111 . . . . . . . . . 111 | 10111 . . . . . . . . . 111 | 0 | 00000000 |
| 57–89 | . . . | 11111 . . . . . . . . . 111 | . . . | 0 | 00000000 |
| 90 | 75 | 11111 . . . . . . . . . 111 | 11111 . . . . . . . . . 110 | 0 | 00000000 | comparator within comparator logic 14. Testing of memory/ logic circuitry 10' can be better understood with reference to the detailed flowchart of FIGS. 5a–5c.

Again, before commencing logic circuit testing, memory array 12 is examined using conventional array built-in self-testing 110. Assuming that no memory failure is uncovered, then one row of memory, arbitrarily chosen as row (0), is written with all 0s, except for the invalid data bits which are written to 1s 112. In the examples discussed in this application, each row of memory is assumed to comprise multiple memory locations M, where M is an integer $\geq 2$, and each memory location M receives N data bits, N being $\geq 2$, one of which comprises the "invalid data bit". A first memory location M(0) is selected in row (0) for processing 114. The N bits of memory location M(0) are written to a corresponding comparator of the M comparators comprising comparator logic 14. The port B input to this comparator receives N-1 "0" bits from BIST 18 via the compare multiplexer 116. Since the invalid data bit comprises a "1", a miscompare should be confirmed at the logic output 118.

The next test pattern is to write memory location M in row (0) to 0s such that the invalid data bit is no longer asserted 120. Zeros are again applied to port B of the comparator logic from BIST 18 via the compare multiplexer 122. Since all 0s are applied to both port A and port B inputs and since the invalid data bits are unasserted, a compare signal of "1" should be output from comparator M(0) of the comparator logic 124.

The next test pattern is established by injecting a "1" into the input shift register at latch (0) and then writing the contents of the input shift register to the memory array at location M(0) 126. Based upon the established test pattern at the inputs to the corresponding comparator M(0), a miscompare signal "0" should be confirmed at the output of the comparator logic 128. Test pattern looping is achieved by shifting the injected "1" to the next latch within the input shift register and writing this new test pattern to memory location M(0) 130, and hence to the port A input of the respective comparator. Again, a miscompare signal ("0") should be confirmed at the output of the comparator 132. This process is repeated until the injected "1" reaches the $(N-1)^{th}$ latch of the input shift register 134. Once there, the BIST determines whether all memory locations M have been exercised 136. Since at this point only memory location M(0) has been exercised, the BIST is instructed to go to the next memory location, i.e., set M=M+1 138. Processing loops back to apply the first test pattern comprising all 0s across ports A & B of the comparator corresponding to this new memory location M.

Once all memory locations and corresponding comparators have been exercised, memory location M(0) in row (0) of the memory array is again chosen 140 to receive an all is pattern from BIST 18, i.e., except for the respective invalid data bit which remains unasserted at "0" 142.

Figure 5A:
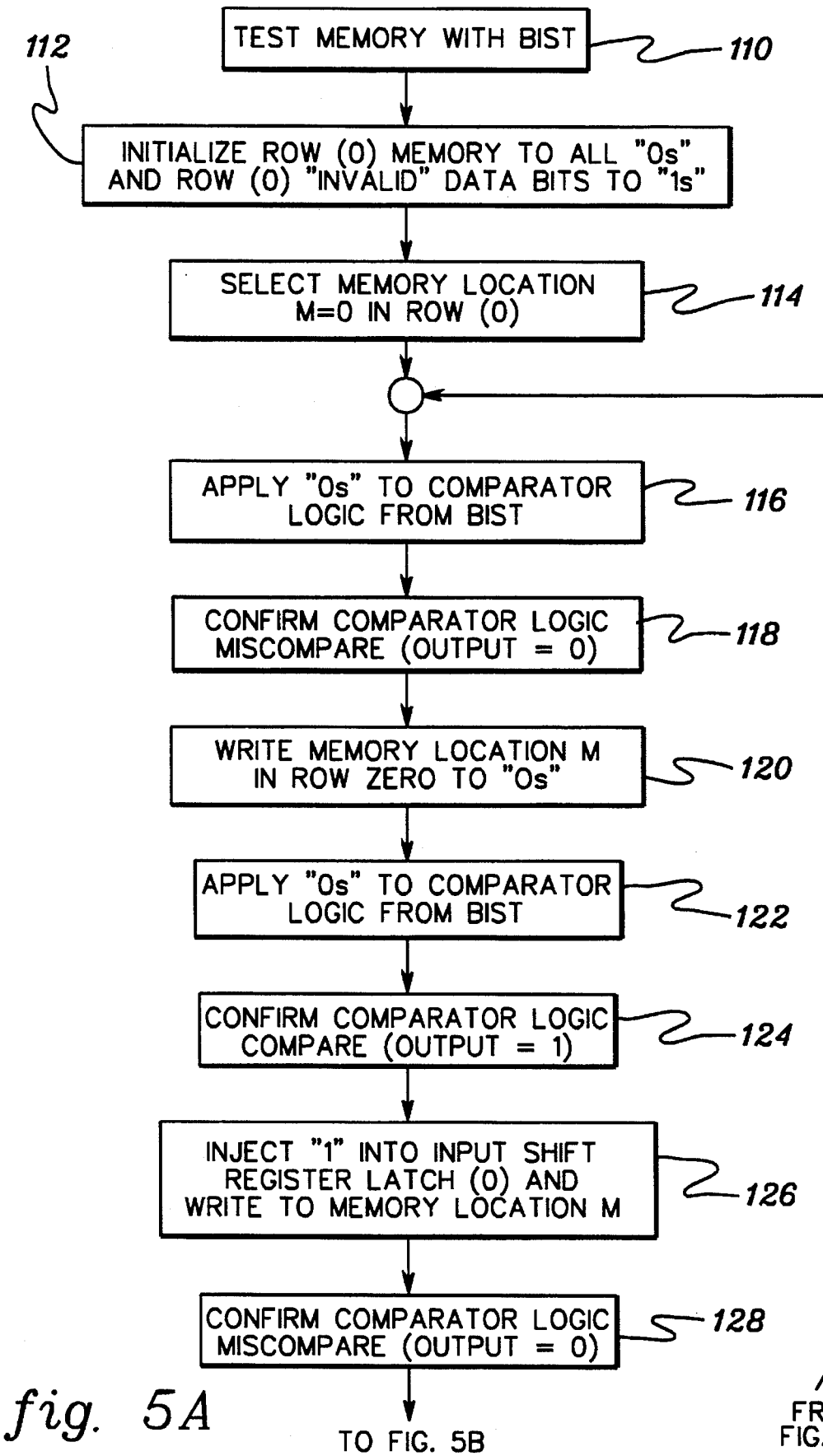
FIGS. 5a–5c is a flowchart of one embodiment of a test process for testing embedded logic at the output of the memory array in the memory array/comparator logic test circuitry of FIG. 4; test circuitry in accordance with the present
Figure 5B:
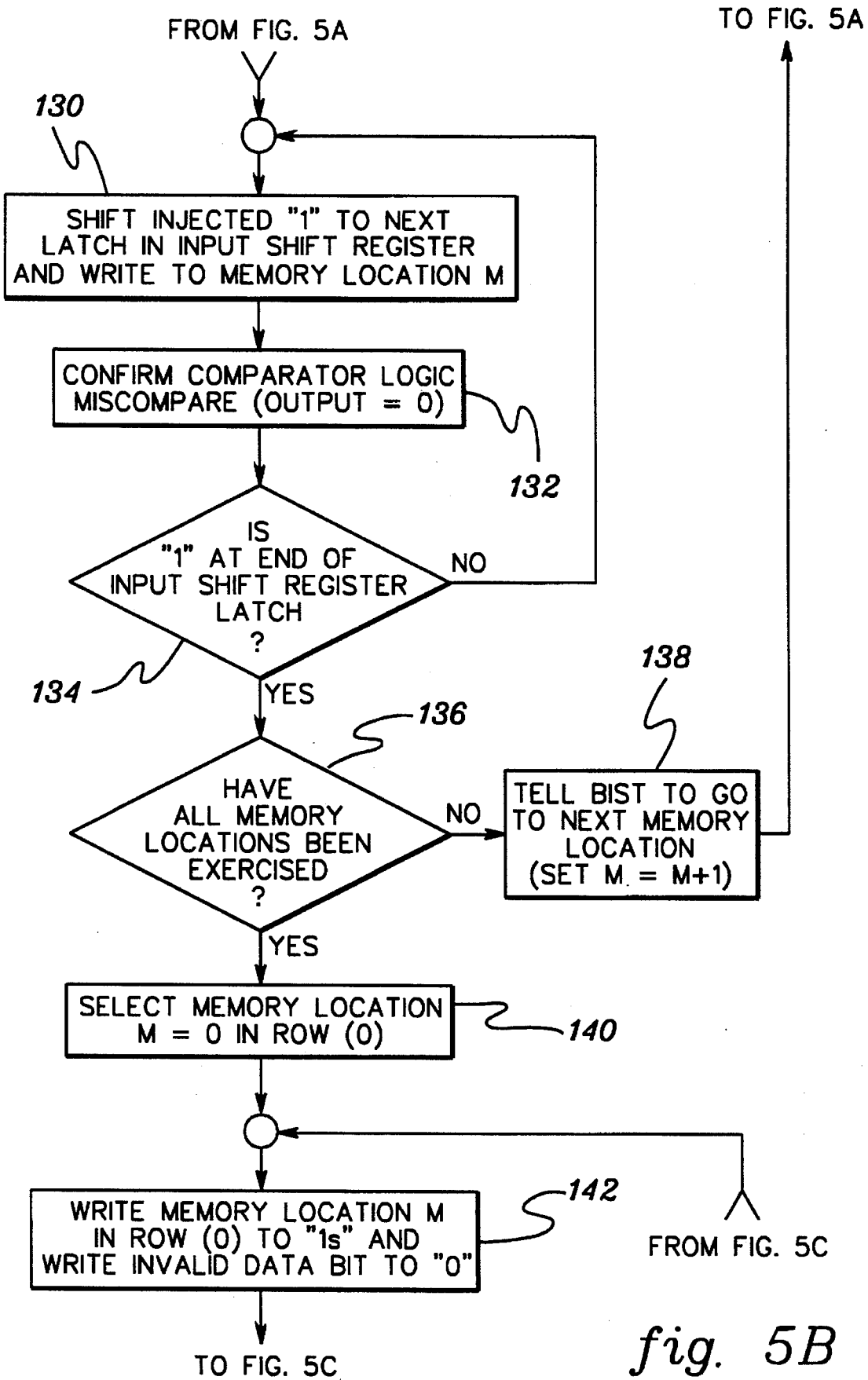
Figure 5C:
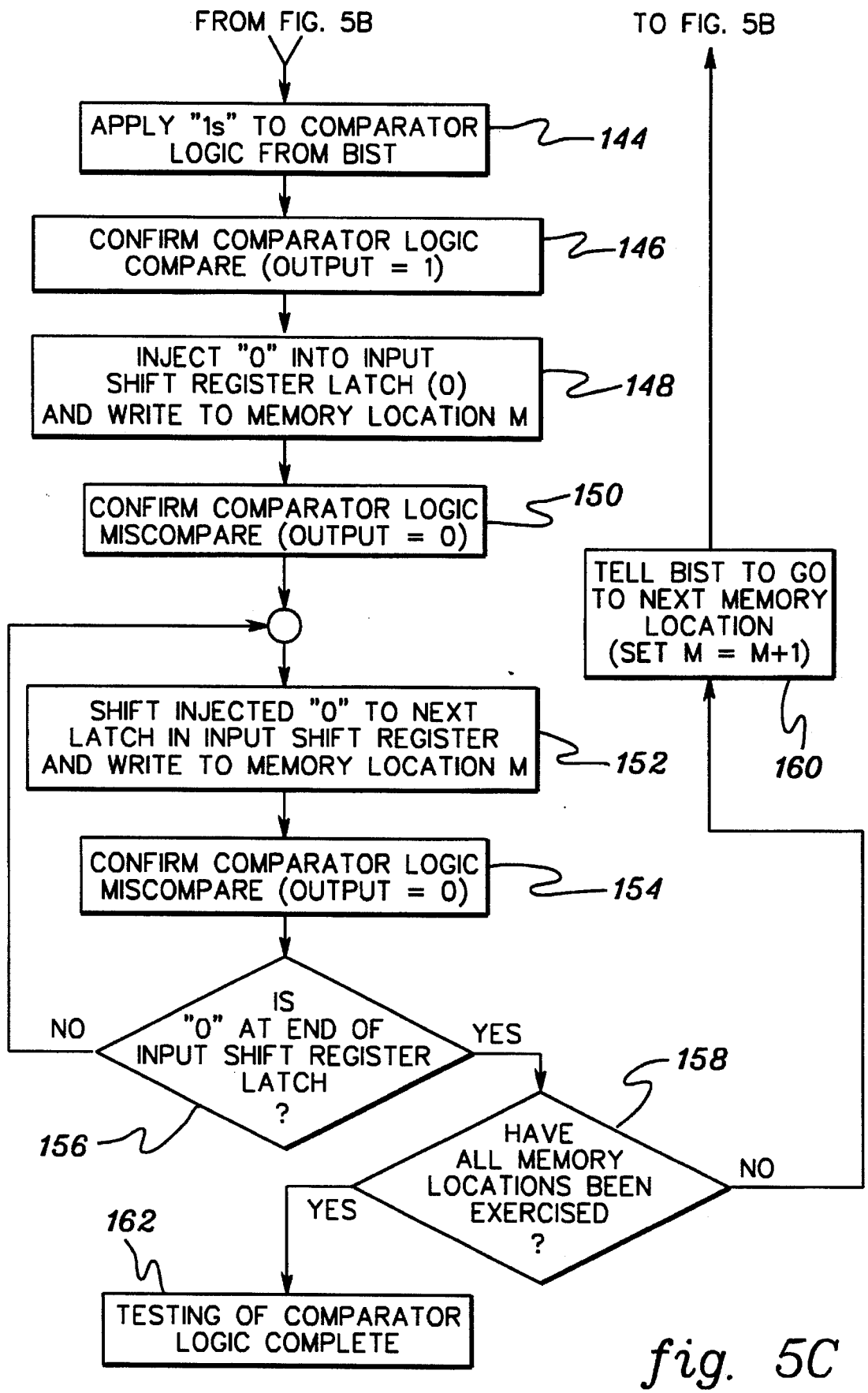

As continued on FIG. 5c, the comparator logic receives at port B an all 1s pattern from the BIST state machine 144. Since all 1s are present across port A and port B, a compare signal "1" should be confirmed at the comparator logic output 146.

Next, a "0" is injected into the input shift register at latch (0) and the contents of the register are written into memory location M 148. Since port A and port B inputs of the corresponding comparator no longer compare, a miscompare signal "0" should be confirmed at the output of the comparator 150. Thereafter, the injected "0" is shifted to the adjacent latch in the input shift register, the contents are written to memory location M 152, and a miscompare signal "0" is confirmed at the output of the comparator 154. This processing is repeated until the injected "0" cycles to the $(N-1)^{th}$ latch in the input shift register 156.

Next, processing inquires whether all memory locations, and thus all comparators, have been exercised 158 and if "no", then the BIST obtains a next memory location M, i.e., sets M=M+1 160. Once all memory locations have been so exercised, testing of the comparator logic is complete 162.

Figure 6:
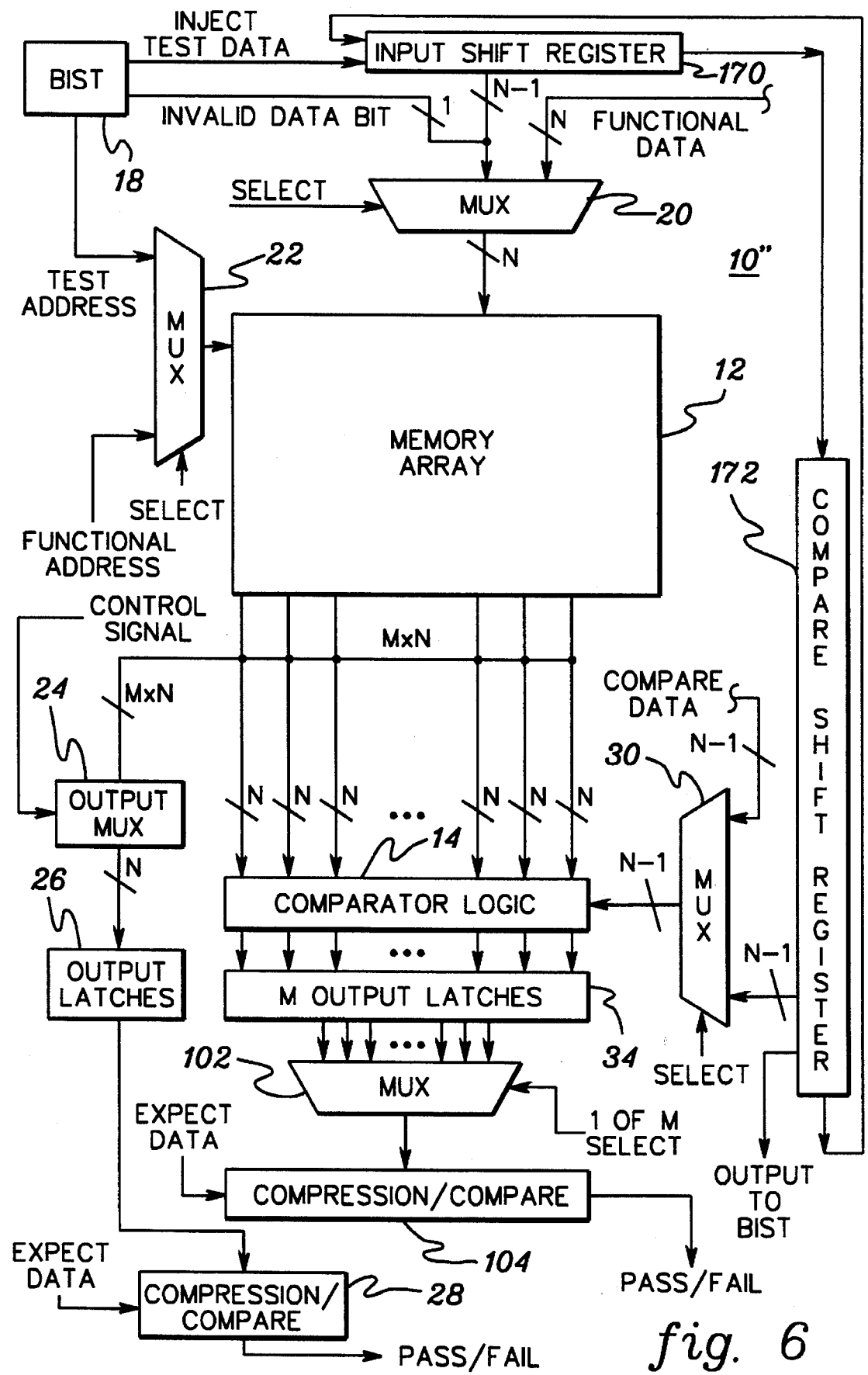
FIG. 6 is a block diagram of still another embodiment of on-chip memory array/comparator logic test circuitry in accordance with the present invention.
Figure 7A:
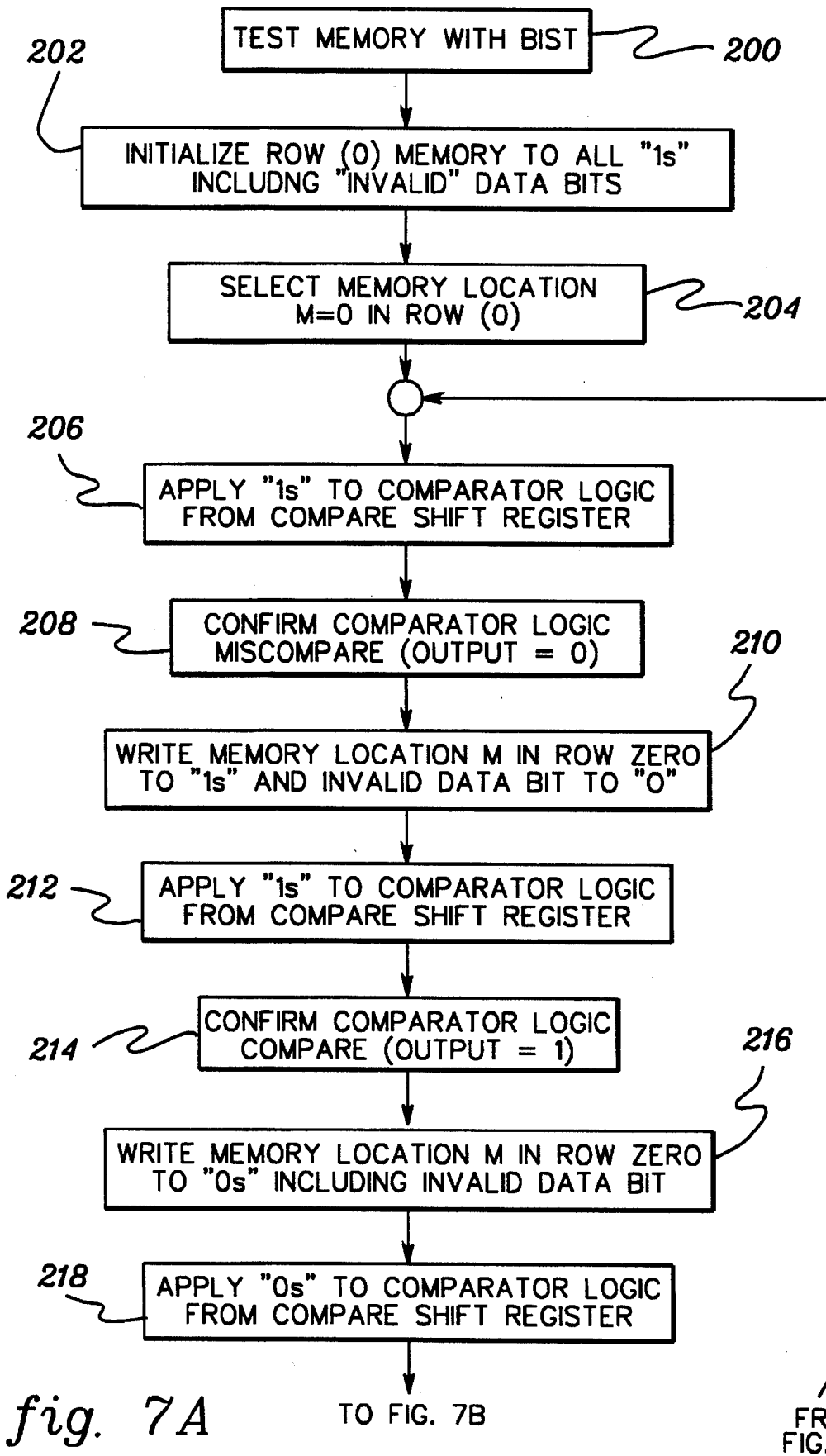
FIGS. 7a & 7b is a flowchart of one embodiment of a process for testing embedded logic at the output of the memory array in the memory array/comparator logic test circuitry of FIG. 6.
Figure 7B:
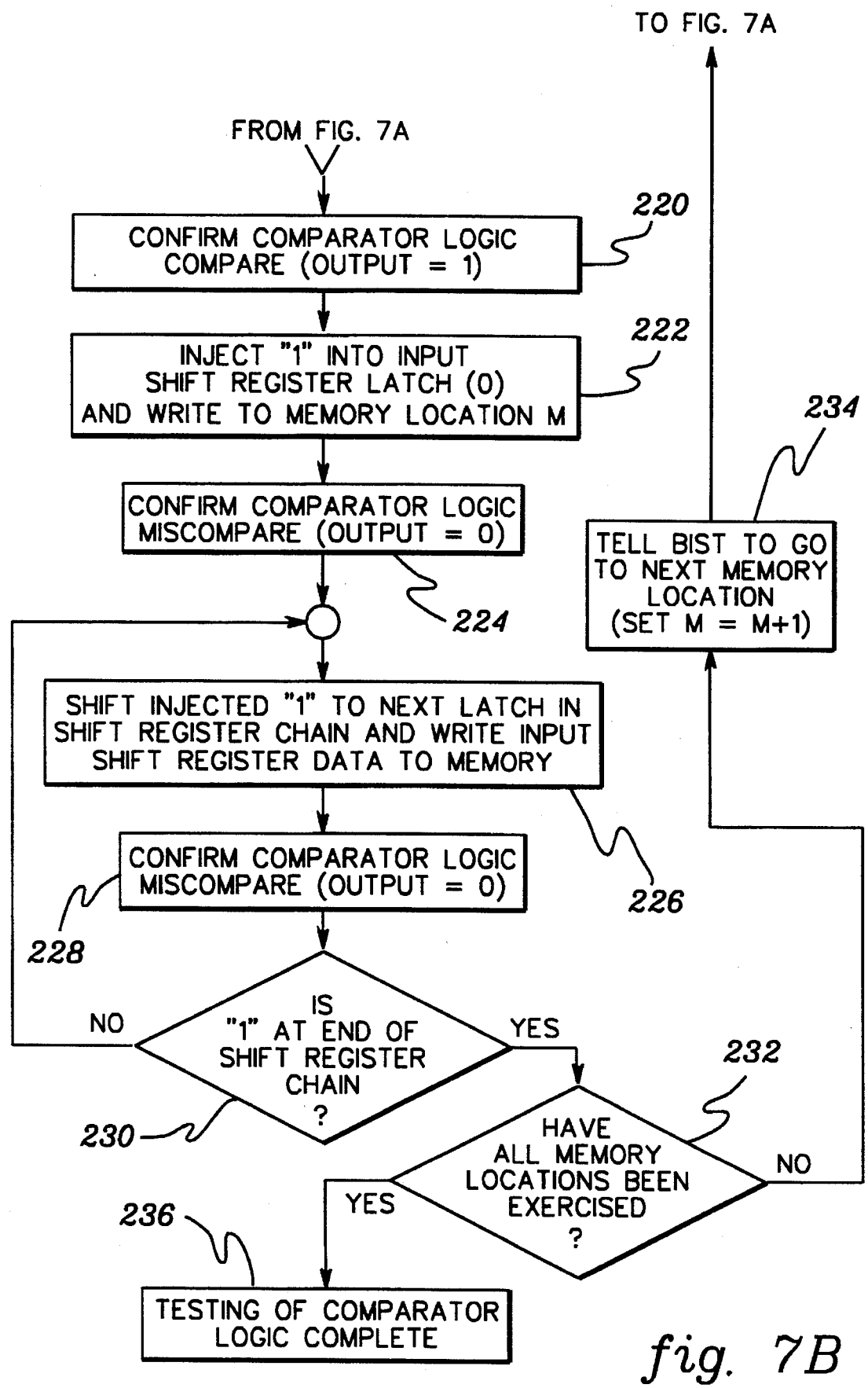

FIG. 6 depicts still another embodiment of a memory/ logic test circuitry 10" structured in accordance with the present invention. In this embodiment the looping test pattern occurs within both an input shift register 170 and a compare shift register 172, with feedback from an end latch of register 172 to a first latch of input shift register 170. Together, shift registers 170 & 172 comprise a shift register chain. Input shift register 170 provides N-1 data bits to memory array 12, which is assumed to be sectioned into multiple memory locations M, each of which has N-1 data bits and an invalid data bit. During testing, the invalid data bit entry is provided directly to array 12 through multiplexer 20 from BIST 18. The balance of circuitry 10" is substantially identical to circuitry 10' depicted and described above in connection with FIG. 4. As with the design of FIG. 4, non-scannable latches are omitted in the FIG. 6 embodiment as an interface between memory array 12 and comparator logic 14. Thus, the memory is written and the compare occurs within the same cycle. In actual implementation, if the compare occurs in the next cycle then a dummy latch stage would be needed between registers 170 & 172 to allow a previous pattern to cycle through memory before an injected "1" or "0" is shifted from register 170 to register 172.

In accordance with this embodiment of the invention, testing of logic circuitry 14 is simplified in that essentially only three different patterns need to be applied through the test data registers 170 & 172. Specifically, an all 1s input, an all 0s input and a looping pattern of a zero within an all is field or a one within in an all 0s field are sufficient to obtain 100% "stuck-fault testing" of the logic circuitry. One testing example employing the memory/logic test circuitry 10" of FIG. 6 is presented in FIGS. 7a & 7b.

Before logic circuit testing, the memory array is conventionally tested employing the BIST state machine 200. Assuming that the memory array passes, then logic circuit testing commences with an initialization of row (0) of memory to all 1s, including the invalid data bits 202. This can be accomplished by loading input shift register 170 with all 1s and transferring its contents through MUX 20 to the memory array, assuming that a particular memory location M(0) is selected within row (0) of the memory array 204. All is are applied directly to the comparator logic from the compare shift register 206. Again, it is assumed that compare shift register 172 (FIG. 6) can be parallel loaded with is by the BIST 18. Further, comparator logic 14 comprises an array of M comparators, each of which is assumed to comprise the logic circuitry of FIG. 6. Since the invalid data bits are asserted in respective locations M, including memory location M(0), a miscompare signal "0" should be confirmed at the comparator output 208. Otherwise, a fail signal is output from compression/compare circuitry 104 (FIG. 6).

Next, memory location M(0) in row (0) is written with all 1760 s, except for the corresponding invalid data bit which is written to "0" such that the comparator logic is allowed to function 210. Commensurate with the application of all "1s"

to the data port A input to the comparator an all "1s" pattern is applied to the comparator logic at port B from the compare shift register portion of the shift register chain 212. Because the invalid data bit is unasserted, a compare signal "1" should be confirmed at the comparator output 214.

The next test pattern requires writing memory location M(0) in row (0) to all 0s, including the invalid data bit 216, and applying an all 0s pattern to port B of the comparator logic from the compare shift register 218. With all 0s applied to both port A and port B, a compare signal "1" should be confirmed at the output of the comparator logic 220.

Miscompare testing is initiated by injecting a "1" into the input shift register at latch (0) and writing the contents of the shift register to memory location M 222. All 0s are assumed to be applied to port B of the comparator logic via the compare shift register. With these inputs, a miscompare signal "0" should be output from the comparator 224. The injected "1" is then shifted to the next latch in the shift register chain consisting of the input shift register and the compare shift register 226. With each shifting of the injected "1" the input shift register data is written to memory location M. Also, with each shifting of the injected "1" test data, a miscompare signal "0" should be confirmed at the output of the comparator 228. The looping continues within the combined shift register chain until the "1" is at the end of the compare shift register 230. Once the injected test data has looped through the entire shift register chain, processing inquires whether all memory locations M in memory array 12 have been exercised 232 If "no," then the BIST state machine is instructed to exercise the next memory location by setting M=M+1 234. Once all memory locations have been exercised, testing of the comparator logic is complete 236.

Other implementations of the concepts presented herein will be apparent to those skilled in the art. For example, logic testing of a typical Content Addressable Memory (CAM) cell is also possible. In a CAM implementation, a wordline is activated to write data to a series of CAM cells connected to a common match line on the same wordline or row. In a next cycle, the wordline is deactivated so as not to disturb data in the memory cells, and compare data is introduced on the same inputs as the written data. The data on the bitlines is then compared to the data in the memory cell and a match or mismatch signal is generated. In this implementation, the comparators are logically analogous to those discussed above coupled to the output of TAG memory. The major difference is that the XNOR circuitry is physically part of the memory array itself. The compare data can be supplied on the same bitlines as the data written to the memory cells or there can be separate lines which allow the compare function to occur in the same cycle as the write function.

To restate, this invention comprises on-chip built-in self-testing of a logic circuit embedded at an output of a memory array without employing boundary scan latches within the functional data path between the memory array and the logic circuit. By eliminating the need for boundary scan latches or multiplexers at the interface, both functional performance and testing performance is enhanced, testing time is decreased and silicon chip area consumed by the testing circuitry is minimized. One hundred percent "stuck-fault coverage" of comparator logic at the output of an address memory array is obtained in the embodiment set forth herein, with a minimum number of test cycles. The design presented requires only one fail/pass bit as an observable output. Monitoring of this fail bit on a tester allows for fails to be pinpointed by cycle counting. The design can be used in self-test of hardware at the wafer level or system level, e.g., during power on.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A system for testing embedded logic circuitry coupled to a memory array, said system comprising:
   a Built-In Self-Test (BIST) for generating a test pattern for testing said logic circuitry; and
   means for providing said test pattern to said logic circuitry including means for writing at least a portion of said test pattern into said memory array and then applying said portion of said test pattern out of said memory array to said logic circuitry for testing said logic circuitry.

2. The system of claim 1, wherein said means for providing said test pattern to said logic circuitry includes a multiplexer circuit connected to said memory array and to said BIST for writing said portion of said test pattern into said memory array as directed by said BIST.

3. The system of claim 2, wherein said logic circuitry comprises a two input logic circuit having a port A input and a port B input, said port A input being electrically coupled to an output port of said memory array and said port B input being electrically coupled to said BIST, and wherein said portion of said test pattern written into said memory array comprises a first portion of said test pattern, and wherein said means for providing said test pattern to said logic circuitry further includes means for applying a second portion of said test pattern to said port B input of said logic circuitry without employing said memory array.

4. The system of claim 3, wherein said first portion of said test pattern comprises a looping test pattern consisting of a shifting 1 bit in a field of 0 bits or a shifting 0 bit in a field of 1 bits, and wherein said means for providing said first portion of said test pattern to said memory array includes an input shift register electrically coupled between said memory array and said BIST, said input shift register having multiple latches and a feedback path from an end latch in the input shift register to a first latch in the input shift register such that contents of the input shift register automatically loop with shifting of said 1 bit in said field of 0 bits or said 0 bit in said field of 1 bits.

5. The system of claim 3, wherein said second portion of said test pattern comprises a looping test pattern consisting of a shifting 1 bit in a field of 0 bits or a shifting 0 bit in a field of 1 bits, and wherein said means for providing said second portion of said test pattern to said logic circuitry includes a compare shift register having multiple latches and a feedback path from an end latch in the compare shift register to a first latch in the compare shift register such that shifting of said 1 bit in said field of 0 bits or said 0 bit in said field of 1 bits results in data from an end latch in the compare shift register being automatically fed back to said first latch in said compare shift register, thereby defining said looping test pattern.

6. The system of claim 3, wherein said first portion of said test pattern and said second portion of said test pattern together comprise a looping test pattern, and wherein said means for providing said first portion of said test pattern to said memory array comprises an input shift register and said means for providing said second portion of said test pattern to said logic circuitry comprises a compare shift register, said input shift register having multiple latches and said compare shift register having multiple latches, an end latch in said input shift register being electrically coupled to output data to a first latch in said compare shift register and an end latch in said compare shift register being electrically coupled back to output data to a first latch in said input shift register, wherein introduction and shifting of a 1 bit in a field of 0 bits or a 0 bit in a field of 1 bits in said input shift register and said compare shift register defines said looping test pattern, said looping test pattern providing different test patterns across said port A input and said port B input of said logic circuitry.

7. The system of claim 3, wherein said logic circuitry comprises comparator logic circuitry and wherein said test pattern comprises a deterministic test pattern.

8. The system of claim 3, further comprising circuit means for providing a pass/fail signal based upon application of said test pattern to said logic circuitry, said pass/fail signal comprising a single bit pass/fail signal.

9. The system of claim 8, wherein said circuit means for providing said pass/fail signal includes a compression/compare circuit coupled to receive an output of said logic circuitry and an expect data signal from said BIST, said compression/compare circuitry comprising means for comparing said output of said logic circuitry and said expect data from said BIST to generate said single bit pass/fail signal.

10. An integrated circuit chip comprising:
a memory array for storing data, said memory array having an input port and an output port;
a logic circuit electrically coupled to the output port of said memory array so that stored data read from said memory array flows via said output port to said logic circuit; and
on-chip Built-In Self-Test (BIST) means for testing said logic circuit including
means for generating a test pattern for testing said logic circuit, and
means for providing said test pattern to said logic circuit including means for writing at least a portion thereof into said memory array and then reading said portion of said test pattern out of said memory array via said output port to said logic circuit for testing said logic circuit.

11. The integrated circuit chip of claim 10, wherein said logic circuit contains a port A input and a port B input, said port A input being electrically coupled to said output port of said memory array, and wherein said portion of said test pattern written to and read from said memory array comprises a first portion of said test pattern, and said on-chip BIST means further comprises means for providing a second portion of said test pattern to port B input of said logic circuit without passing said second portion of said test pattern through said memory array.

12. The integrated circuit chip of claim 11, wherein said port A input and said port B input are each N-1 bits wide, N being an integer ≧2, and wherein said second portion of said test pattern comprises a looping test pattern consisting of a shifting 1 bit in a field of N-2 0 bits or a shifting 0 bit in a field of N-2 1 bits, and wherein said first portion of said test pattern comprises either N-1 1 bits or N-1 0 bits.

13. The integrated circuit chip of claim 11, wherein said port A input and said port B input are each N-1 bits wide, N being an integer ≧2, and wherein said first portion of said test pattern comprises a looping test pattern consisting of a shifting 1 bit in a field of 0 bits or a shifting 0 bit in a field of 1 bits, and wherein said second portion of said test pattern comprises either all 0 bits or all 1 bits.

14. The integrated circuit chip of claim 11, wherein said means for providing said second portion of said test pattern to said logic circuit includes a compare shift register electrically coupled between said means for generating said test pattern and said logic circuit, said compare shift register comprising means for presenting said second portion of said test pattern to said port B input of said logic circuit.

15. The integrated circuit chip of claim 11, wherein said means for writing said first portion of said first test pattern into said memory includes an input shift register electrically coupled between said means for generating said test pattern and said input port of said memory array, said input shift register including feedback means between an end latch in said input shift register and a first latch in said input shift register, said first portion of said test pattern comprising a looping test pattern consisting of a shifting 1 bit in a field of 0 bits or a shifting 0 bit in a field of 1 bits.

16. The integrated circuit chip of claim 11, wherein said first portion of said test pattern includes N bits, N being an integer ≧2, and wherein one bit of said N bits comprises an invalid data bit which when asserted disables operation of said logic circuit.

17. The integrated circuit chip of claim 10, wherein said integrated circuit chip comprises a microprocessor chip, said memory array comprises a directory array and said logic circuit comprises a comparator logic circuit.

18. A method for testing embedded logic circuitry coupled to a memory array on a semiconductor device chip said method comprising the steps of:
(a) employing Built-In Self-Test (BIST) to generate a test pattern for testing said logic circuitry;
(b) writing at least a portion of said test pattern into said memory array; and
(c) applying said portion of said test pattern in said memory array to said logic circuitry for testing said logic circuitry.

19. The method of claim 18, wherein said writing step (b) comprises writing a first portion of said test pattern into said memory array, and wherein said method further comprises the step of providing a second portion of said test pattern to said logic circuitry without writing said second portion of said test pattern into said memory array.

20. The method of claim 19, wherein said first portion of said test pattern comprises all 1 bits or all 0 bits, and wherein said second portion of said test pattern comprises a looping test pattern consisting of a shifting 1 bit in a field of 0 bits or a shifting 0 bit in a field of 1 bits.

21. The method of claim 19, wherein said first portion of said test pattern comprises a looping test pattern consisting of a shifting 1 bit in a field of 0 bits or a shifting 0 bit in a field of 1 bits, and wherein said second portion of said test pattern comprises all 1 bits or all 0 bits.

22. The method of claim 18, wherein said embedded logic circuitry and memory array reside on a microprocessor chip, and wherein said method further comprises performing said steps (a)-(c) automatically upon activation of said microprocessor chip.

* * * * *

UNITED STATES PATENT AND TRADEMARK OFFICE
CERTIFICATE OF CORRECTION

PATENT NO.: 5,553,082

DATED: Sep. 3, 1996

INVENTOR(S): Connor et al.

It is certified that error appears in the above-identified patent and that said Letters Patent is hereby corrected as shown below:

Column 3, lines 49 & 50 after ";" delete "test circuitry in accordance with the present".

<u>In the Claims</u>:

Column 10, line 65 delete "1760 s" and substitute therefor --1s--.

Signed and Sealed this

Twenty-fifth Day of February, 1997

Attest:

BRUCE LEHMAN

*Attesting Officer*     *Commissioner of Patents and Trademarks*